(12) United States Patent
Omote et al.

(10) Patent No.: US 9,095,050 B2
(45) Date of Patent: Jul. 28, 2015

(54) PLATE MEMBER FOR HOUSING, HOUSING, AND METHOD OF FABRICATING THE SAME

(75) Inventors: Koji Omote, Kawasaki (JP); Koichi Kimura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 221 days.

(21) Appl. No.: 13/335,050

(22) Filed: Dec. 22, 2011

(65) Prior Publication Data

US 2012/0118629 A1   May 17, 2012

Related U.S. Application Data

(63) Continuation of application No. PCT/JP2010/060997, filed on Jun. 28, 2010.

(30) Foreign Application Priority Data

Jul. 2, 2009   (JP) .................................. 2009-157418

(51) Int. Cl.
*H05K 5/02* (2006.01)
*B32B 1/00* (2006.01)
*B32B 3/30* (2006.01)
(Continued)

(52) U.S. Cl.
CPC .. *H05K 5/02* (2013.01); *B32B 1/00* (2013.01); *B32B 3/30* (2013.01); *B32B 7/12* (2013.01); *B32B 21/042* (2013.01); *B32B 21/08* (2013.01); *B32B 21/14* (2013.01); *B32B 27/302* (2013.01); *G06F 1/1601* (2013.01); *G06F 1/1613* (2013.01); *G06F 1/181* (2013.01); *H05K 5/0243* (2013.01); *B32B 2250/05* (2013.01); *B32B 2307/3065* (2013.01); *B32B 2457/00* (2013.01); *Y10T 428/1348* (2015.01)

(58) Field of Classification Search
CPC .......... B32B 1/00; B32B 21/042; B32B 7/12; B32B 21/08; B32B 27/14; H05K 5/0243; H05K 5/02
USPC ........... 174/565; 428/316.6, 35.6, 411.1, 141, 428/209; 361/679.1, 679.2
See application file for complete search history.

(56) References Cited

U.S. PATENT DOCUMENTS 2,804,418 A * 8/1957 King .............................. 428/529
5,938,881 A * 8/1999 Kawata et al. ............. 156/307.4
(Continued)

FOREIGN PATENT DOCUMENTS

CN   11116158 A   2/1996
CN   1886972 A   12/2006
(Continued)

OTHER PUBLICATIONS

International Search Report for International Application No. PCT/JP2010/060997 dated Jul. 20, 2010.
(Continued)

*Primary Examiner* — Ishwarbhai B Patel
*Assistant Examiner* — Paresh Paghadal
(74) *Attorney, Agent, or Firm* — Kratz, Quintos & Hanson, LLP

(57) ABSTRACT

A plate member for a housing has a wood part including a plurality of wood plates that are stacked, and a resin part adhered on the wood part and including a plurality of resin sheets that are stacked. Each of the plurality of resin sheets includes a plurality of pores.

2 Claims, 24 Drawing Sheets

(51) Int. Cl.
*B32B 7/12* (2006.01)
*B32B 21/04* (2006.01)
*B32B 21/08* (2006.01)
*B32B 21/14* (2006.01)
*B32B 27/30* (2006.01)
*G06F 1/16* (2006.01)
*G06F 1/18* (2006.01)

(56) References Cited

U.S. PATENT DOCUMENTS

| | | |
|---|---|---|
| 6,596,408 B1 * | 7/2003 | Endoh et al. ............... 428/524 |
| 2002/0189491 A1 | 12/2002 | Rettenbacher et al. |
| 2005/0196588 A1 | 9/2005 | Suzuki |
| 2005/0276874 A1 * | 12/2005 | Menaldo et al. ........... 425/129.1 |
| 2006/0001192 A1 * | 1/2006 | Oohashi et al. ............. 264/279 |
| 2007/0190876 A1 * | 8/2007 | Ogawa et al. ............... 442/136 |
| 2009/0173429 A1 | 7/2009 | Shimamura |

FOREIGN PATENT DOCUMENTS

| | | |
|---|---|---|
| CN | 1921972 A | 2/2007 |
| CN | 101374392 A | 2/2009 |
| EP | 0657310 B1 | 8/1998 |
| JP | 5-4306 | 1/1993 |
| JP | 11-309745 | 11/1999 |
| JP | 2003-73608 A1 | 3/2003 |
| JP | 2006-130787 A1 | 5/2006 |
| JP | 2006-315397 A1 | 11/2006 |
| JP | 2010-147377 A1 | 7/2010 |

OTHER PUBLICATIONS

Chinese Office Action dated Aug. 5, 2014, for counterpart Chinese Patent Applicaiton No. 201080029865.0 with English translation.
Chinese Office Action for the Corresponding CN Application No. 201080029865.0, mailed on Feb. 28, 2015 with full translation.

* cited by examiner

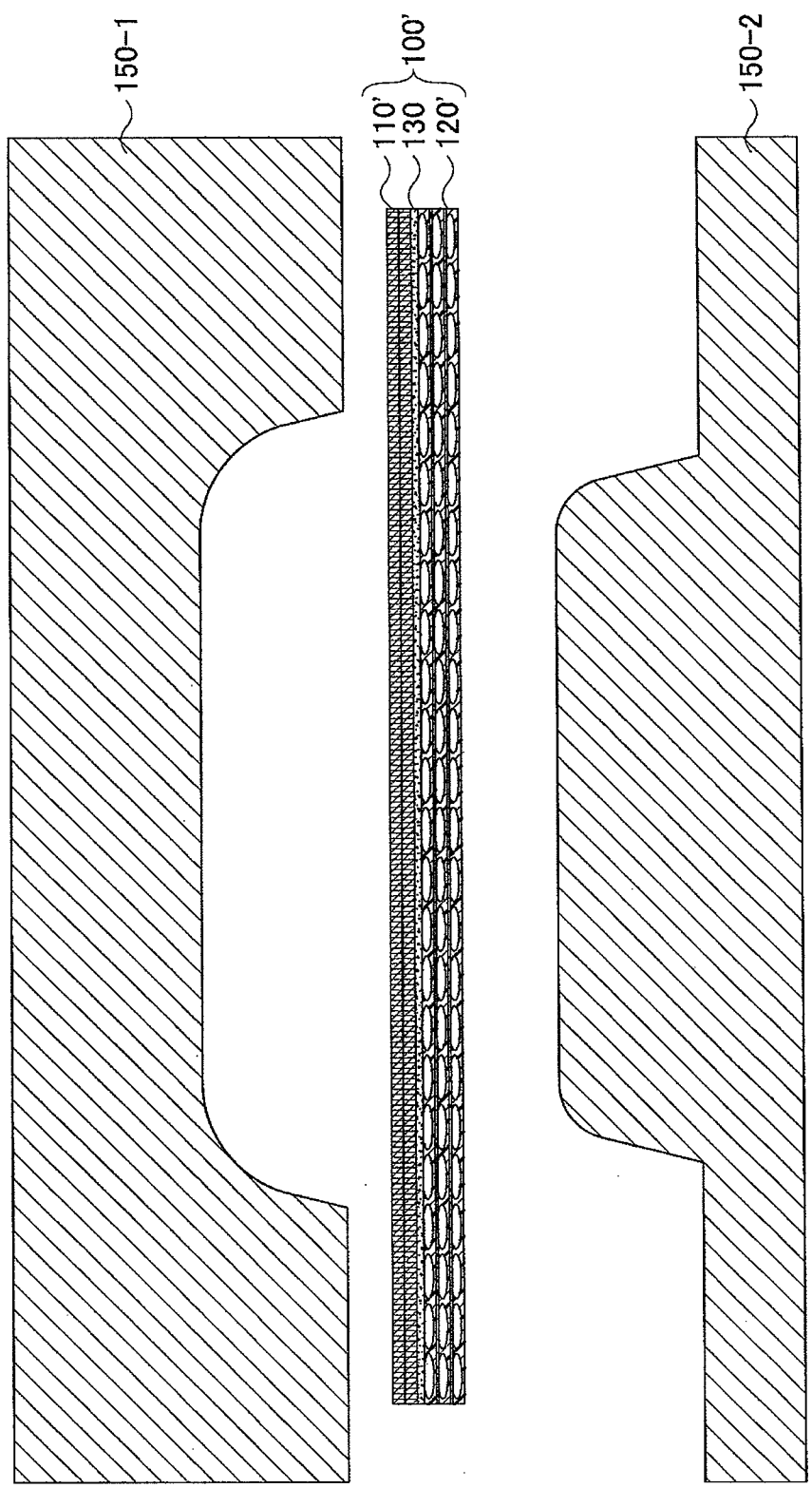

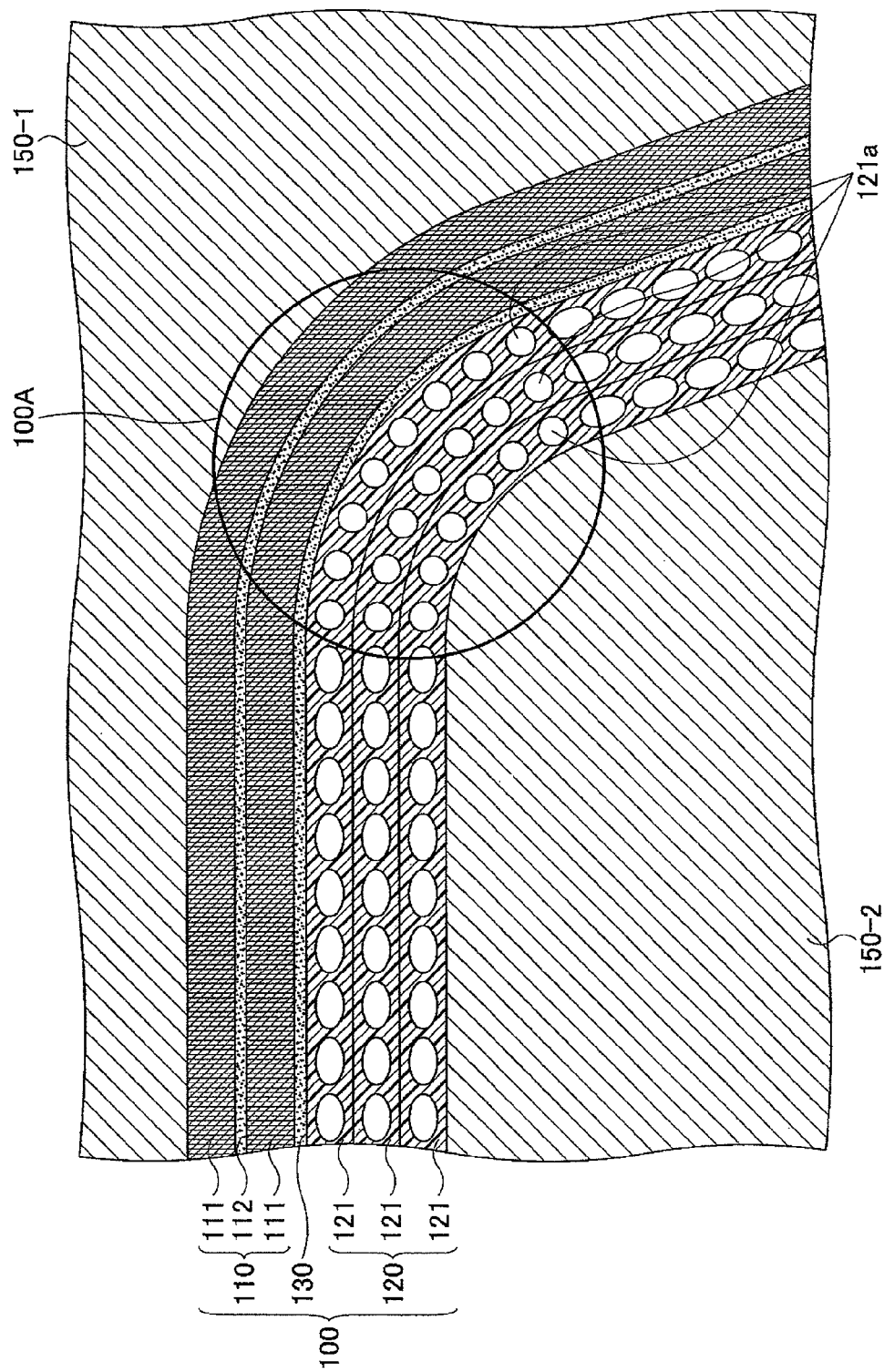

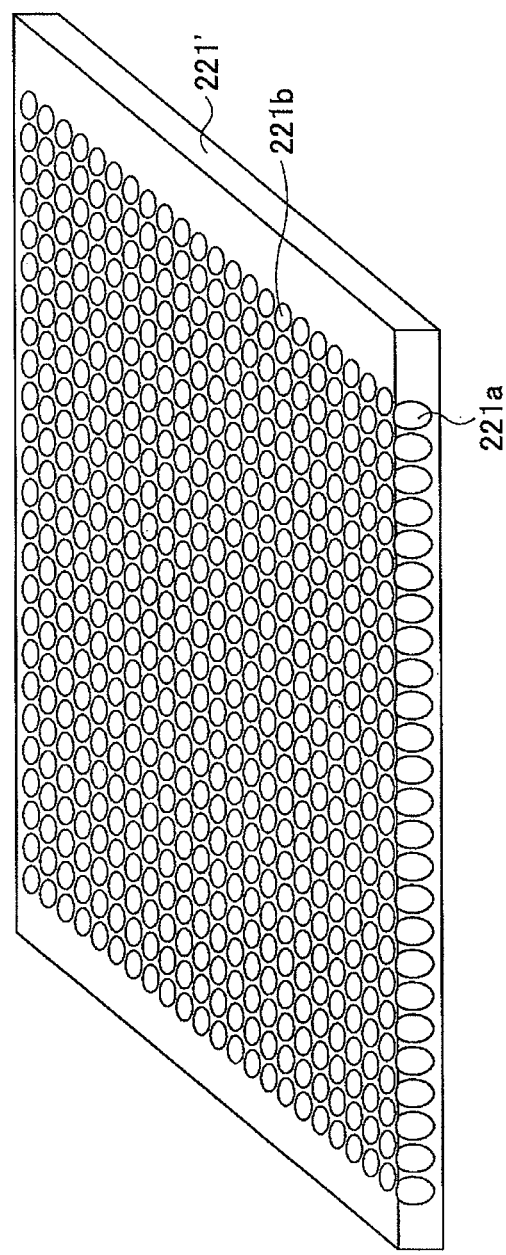

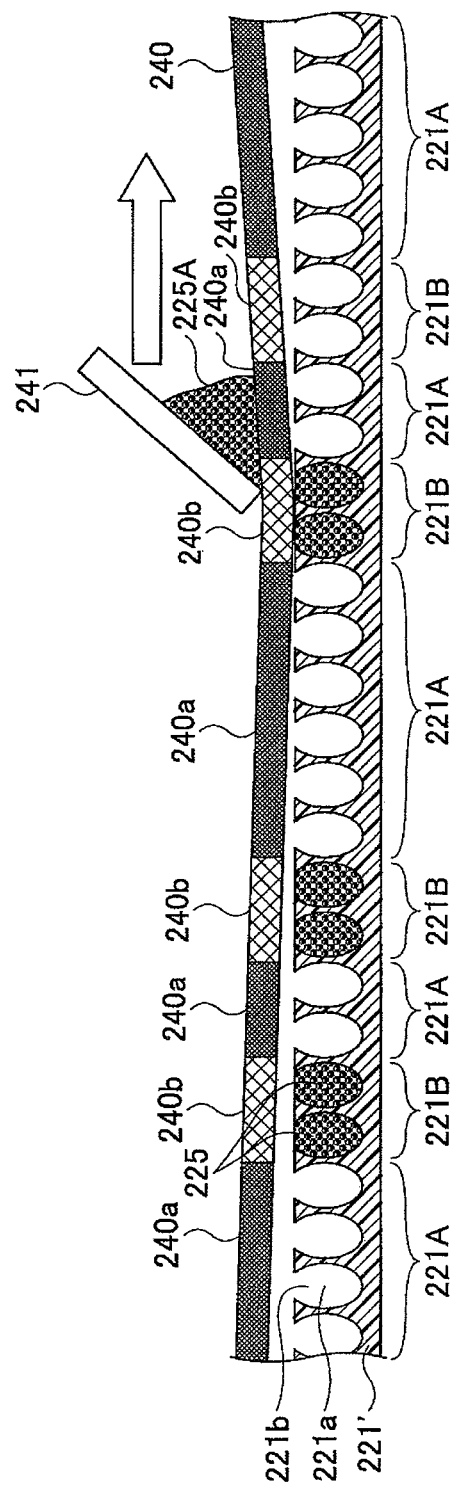

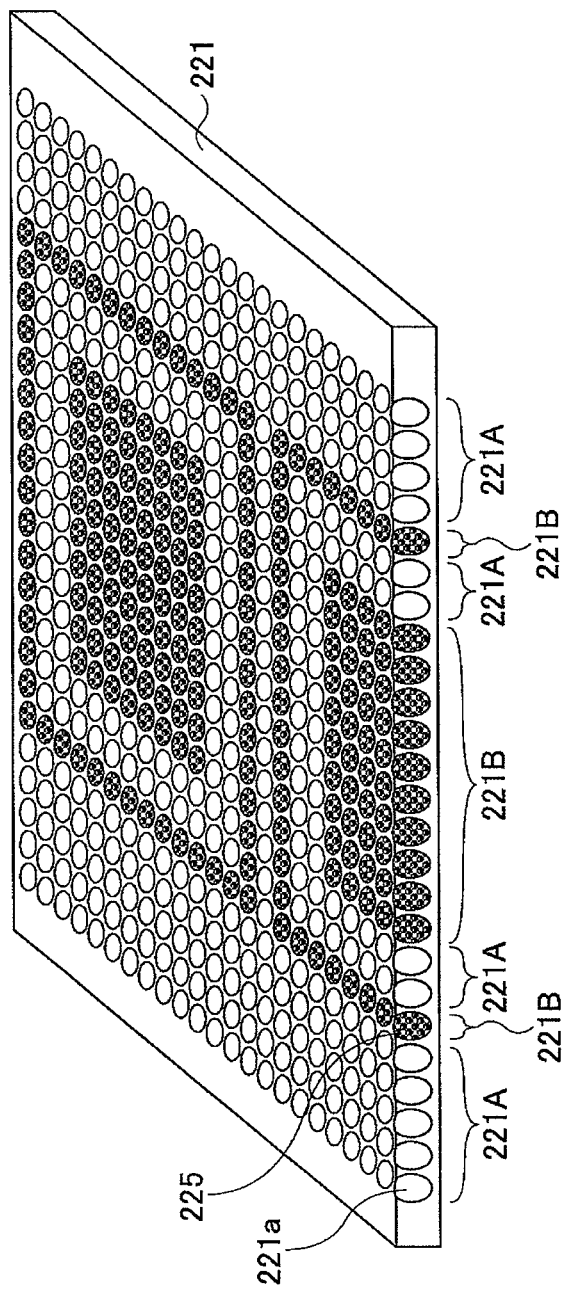

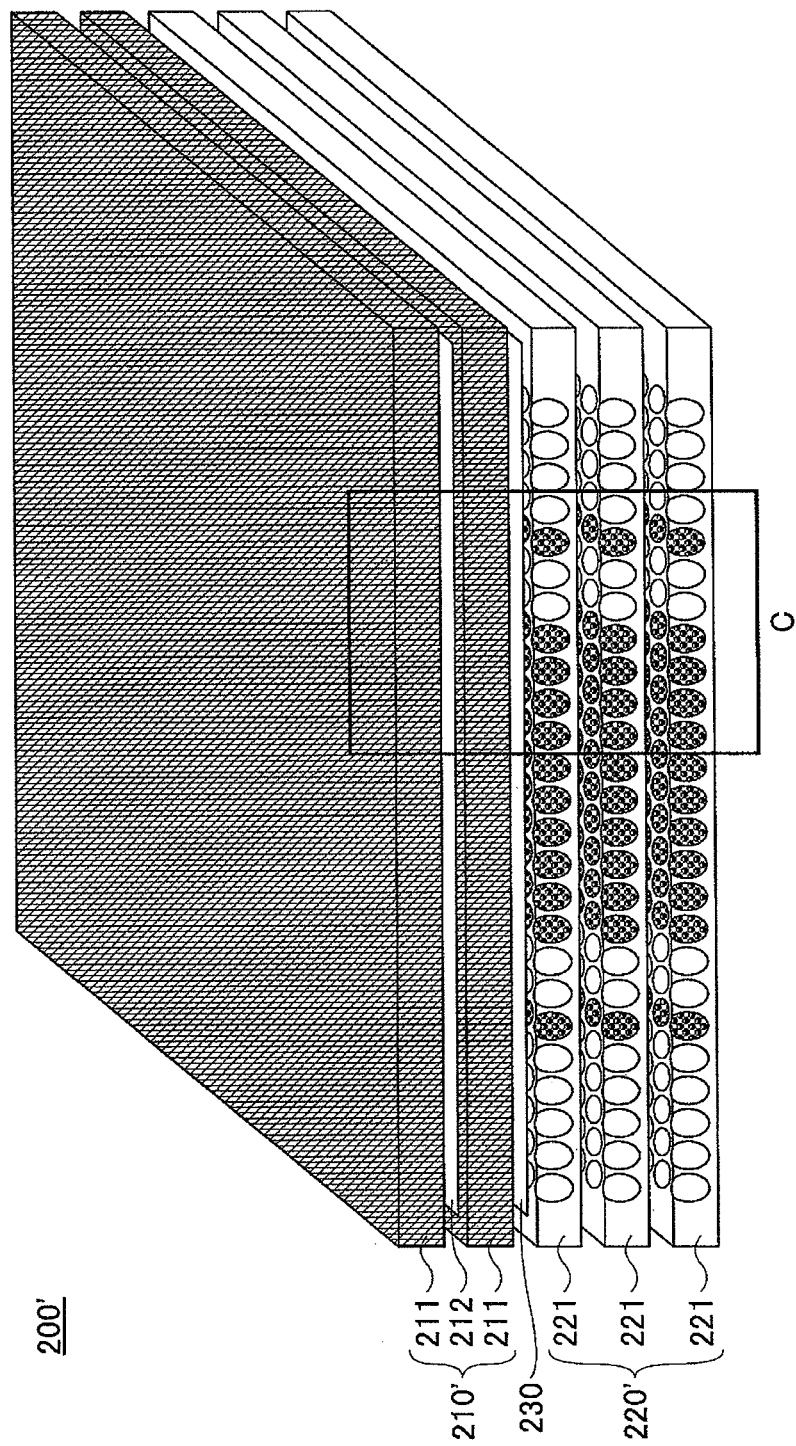

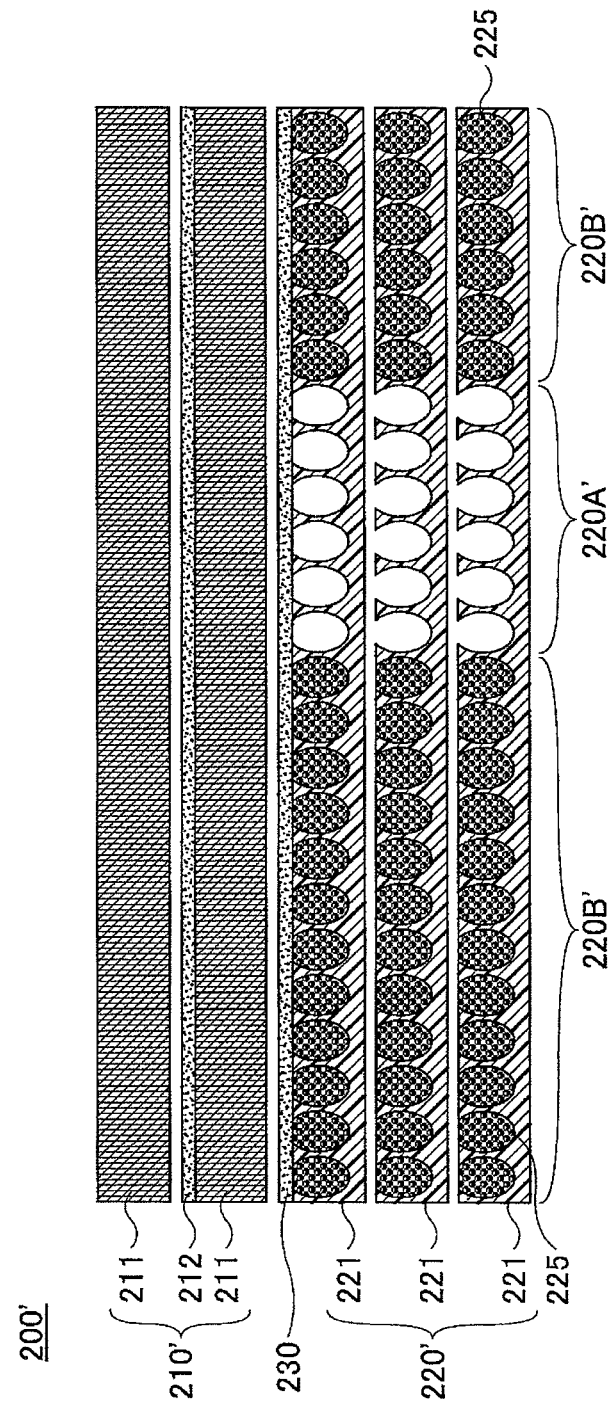

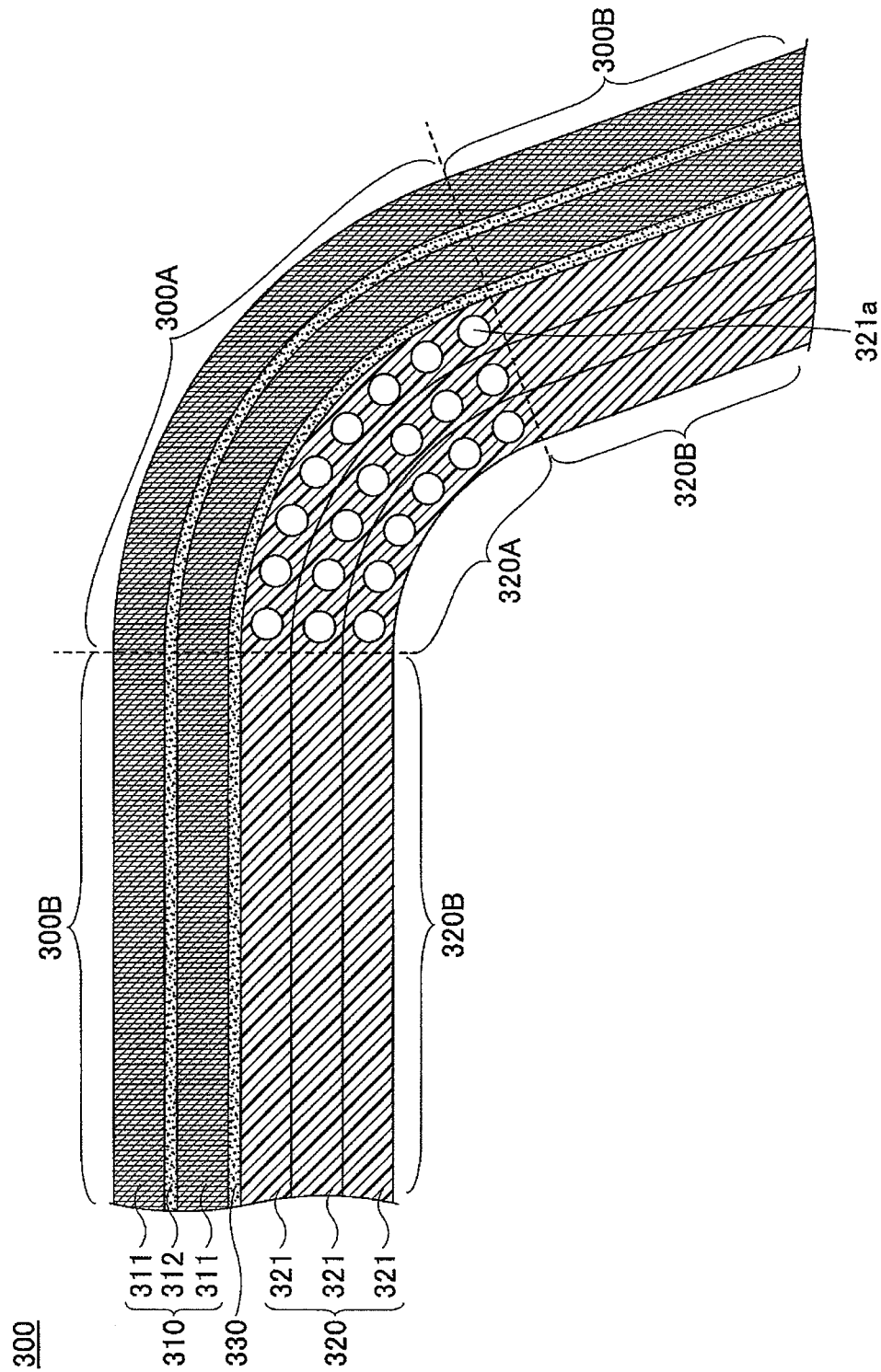

PLATE MEMBER FOR HOUSING, HOUSING, AND METHOD OF FABRICATING THE SAME

CROSS-REFERENCE TO RELATED APPLICATIONS

This application is a continuation application filed under 35 U.S.C. 111(a) claiming the benefit under 35 U.S.C. 120 and 365(c) of a PCT International Application No. PCT/JP2010/060997 filed on Jun. 28, 2010, which is based upon and claims the benefit of priority of the prior Japanese Patent Application No. 2009-157418, filed on Jul. 2, 2009, the entire contents of which are incorporated herein by reference.

FIELD

The present invention relates to a plate member for a housing, a housing and an electronic equipment using such a plate member, and a method of fabricating the plate member.

BACKGROUND

Recently, due to increased interest in environment-friendly materials, proposals have been made to use natural materials in various kinds of industrial products. For example, a housing for lap-top computers, made of a bioplastic material, has been proposed. From the point of view of being decorative in addition to being environment-friendly, natural wood is used in various kinds of industrial products. For example, natural wood is used for finishing or armored surfaces of bags and the like and for housings of electronic equipments such as calculators. There is active study to utilize the natural materials for the housings of electronic equipments, and in particular, natural wood that has decorative grains.

Conventionally, in the wood products or partially wood products, the wood is impregnated with a specific resin in order to improve the applicability. In addition, techniques, such as pressing, have been developed in order to process the wood into a desired shape.

When using the wood material for the finishing or armored surface of the housing used for PDAs (Personal Digital Assistants), PCs (Personal Computers) and the like, the decorative feature of the wood grain may be an important basic feature. Typically, the wood material used for the finishing or armored surface should not include exposed surface defects, such as worm-eaten parts, rotted parts, split parts, and scratches. For this reason, most thinnings are excluded from use for the finishing or armored surface. In addition, defects such as splits and cracks should be avoided when forming the housing or after forming the housing. If the defect is generated when the housing is formed or after the housing is formed, the wood material may no longer be suitable for the housing as a product having commercial value, even though the wood material was originally suited for the housing.

Further, a heat generating element, such as a semiconductor device, may be provided in the housing of the electronic equipment. For this reason, the housing is required to satisfy a fire-resistant standard. Thus, when using the wood material for the housing having such a requirement, the heat generating element is covered by an enclosure made of a fire-resistant material, such as a metal plate. Alternatively, the wood material is coated or impregnated with a fire-resistant agent in order to make the wood housing itself fire-resistant.

Next, a description will be given of a method of forming processed wood having a curved part, by referring to FIGS. 1A through 1F. FIGS. 1A through 1F are cross sectional views for explaining an example of the method of forming the processed wood having the curved part.

First, as illustrated in FIG. 1A, a plurality of wood plates (or plywood) 11 are stacked via an adhesive agent 12, and the wood plates 11 are bonded together to form a provisionally stacked plywood 13. The provisionally stacked plywood 13 is softened in a water vapor environment 14. From the point of view of efficient utilization of resources and/or minimizing costs, thinnings may be used for the wood plates 12, even though the thinnings often include parts with different densities such as gnarls and/or parts with different brittleness. In addition, the thinnings may be used only for the wood plates 12 between the two outermost wood plates 12 forming the finishing or armored surfaces, As illustrated in FIG. 1B, the provisionally stacked plywood 13 that is softened is inserted between a female die 15-1 and a male die 15-2 of an exclusive metal form die 15, and is formed into a workpiece 16 having curved parts, as illustrated in FIG. 10.

The dies 15-1 and 15-2 are separated in order to obtain the workpiece 16 made of the plywood, as illustrated in FIG. 1D. The workpiece 16 is chamfered in order to obtain a chamfered member 18 illustrated in FIG. 1E. Thereafter, the chamfered member 18 is impregnated with a flame retardant (or a fire-resistant agent), in order to obtain a wood workpiece 19 having the curved parts, as illustrated in FIG. 1F.

However, when using the metal form die 15 illustrated in FIG. 10, stress is concentrated at the curved parts of the provisionally stacked plywood 13 and thus at the curved parts of the workpiece 16. Consequently, a split or crack 17 may be generated at the curved part of a workpiece 16', as illustrated in FIG. 2. FIG. 2 is a cross sectional view for explaining a split or crack generated at the curved part of the workpiece. In addition, a crack and/or warp may be generated at parts with different densities such as gnarls and/or parts with different brittleness, which may exist locally in the case of natural wood. Moreover, when the chamfered member 18 is impregnated with the flame retardant in FIG. 1F, a warp or strain may be generated in the wood workpiece 19 due to moisture absorption. Particularly when a gnarl exists inside the wood workpiece 19, the impregnation state may become different between the gnarl and parts surrounding the gnarl, to thereby increase the warp or strain. These problems may depend on the kind of wood and/or the quality of wood used, and it may be difficult to suppress inconsistencies in the wood workpiece 19 that is fabricated.

Therefore, according to the technique that stacks a plurality of wood plates and forms the curved parts by pressing, the crack and/or warp may be generated at the curved part and/or the uneven quality part of the wood when the curved part is formed by pressing, to thereby deteriorate the yield. In addition, when the wood material is impregnated with the flame retardant, the warp and/or strain may be generated due to the quality of wood or the unevenness of the wood quality, to thereby also deteriorate the yield. Such deterioration in the yield increases the fabrication cost of the wood housing, and may prevent the use of natural wood for the housing of the industrial products such as electronic equipments. Moreover, when a fire-resistant enclosure is provided within the housing instead of impregnating the wood material of the housing with the flame retardant, the housing structure may become bulky or thick. Further, the number of parts increases due to the provision of the fire-resistant enclosure, to thereby increase the fabrication cost of the wood housing.

SUMMARY

One aspect of the present invention is to provide a plate member for a housing, a housing and an electronic equipment using such a plate member, and a method of fabricating the plate member, which uses a wood material and may improve the yield at the time of pressing the plate member.

According to one aspect of the present invention, a plate member for a housing may include a wood part including a plurality of wood plates that are stacked; and a resin part, adhered on the wood part, and including a plurality of resin sheets that are stacked, wherein each of the plurality of resin sheets includes a plurality of pores.

According to another aspect of the present invention, a housing may include a wood part including one or a plurality of wood plates that are stacked; and a resin part, adhered on the wood part, and including one or a plurality of resin sheets that are stacked, wherein a combination of the wood part and the resin part includes at least one curved part, and wherein the one or the plurality of resin sheets include a plurality of pores in the curved part.

According to still another aspect of the present invention, a method of fabricating a housing may include stacking a wood part including one or a plurality of wood plates, and a resin part including one or a plurality of resin sheets; and pressing a combination of the wood part and the resin part in order to form a curved part, wherein the one or the plurality of resin sheets include a plurality of pores in the curved part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 4A through 4E are diagrams for explaining an example of a method of fabricating the housing in the first embodiment;

FIGS. 6A through 6I are diagrams for explaining an example of the method of fabricating the housing in the second embodiment;

FIG. 7 is a cross sectional view illustrating an example of the housing in a third embodiment;

DESCRIPTION OF EMBODIMENTS

Figure 1A:
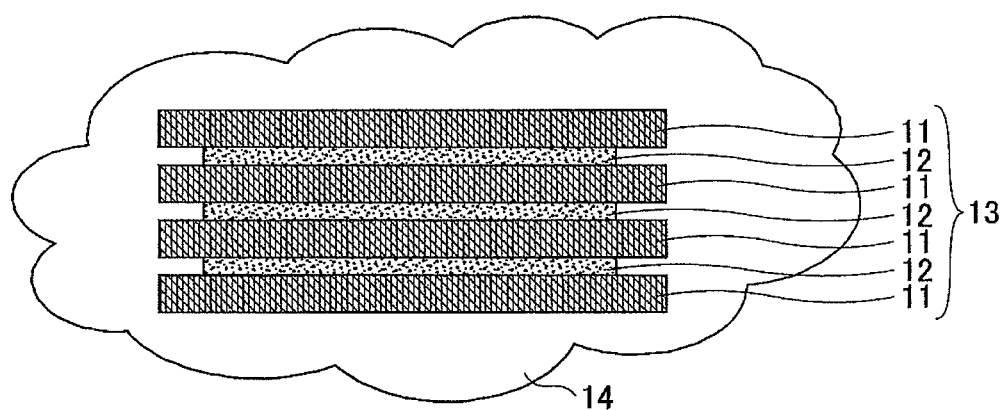
FIGS. 1A through 1F are cross sectional views for explaining an example of a method of forming processed wood having a curved part.
Figure 1B:
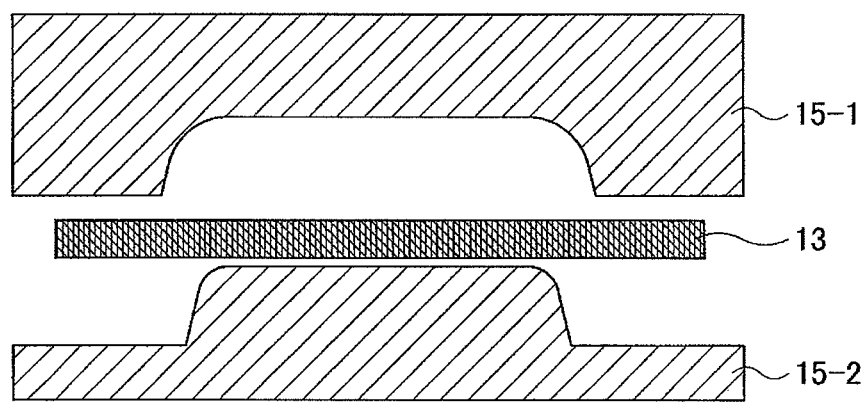
Figure 1C:
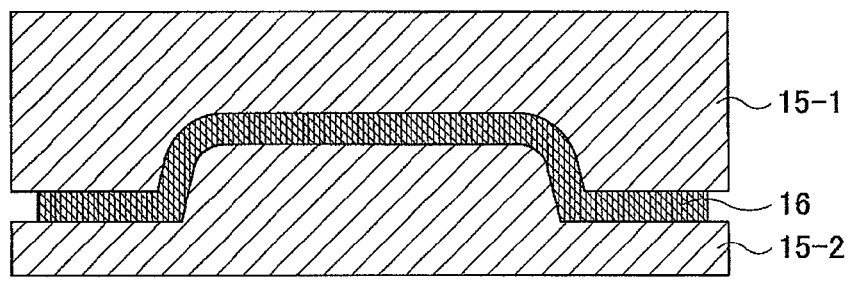

Preferred embodiments of the present invention will be described with reference to the accompanying drawings.

A description will now be given of a plate member for a housing, a housing and an electronic equipment using such a plate member, and a method of fabricating the plate member, in each embodiment according to the present invention, by referring to FIGS. 3 through 11. In the drawings, various elements are not necessarily illustrated on the same scale, and the same or corresponding parts are designated by the same reference numerals.

First Embodiment

Figure 3:
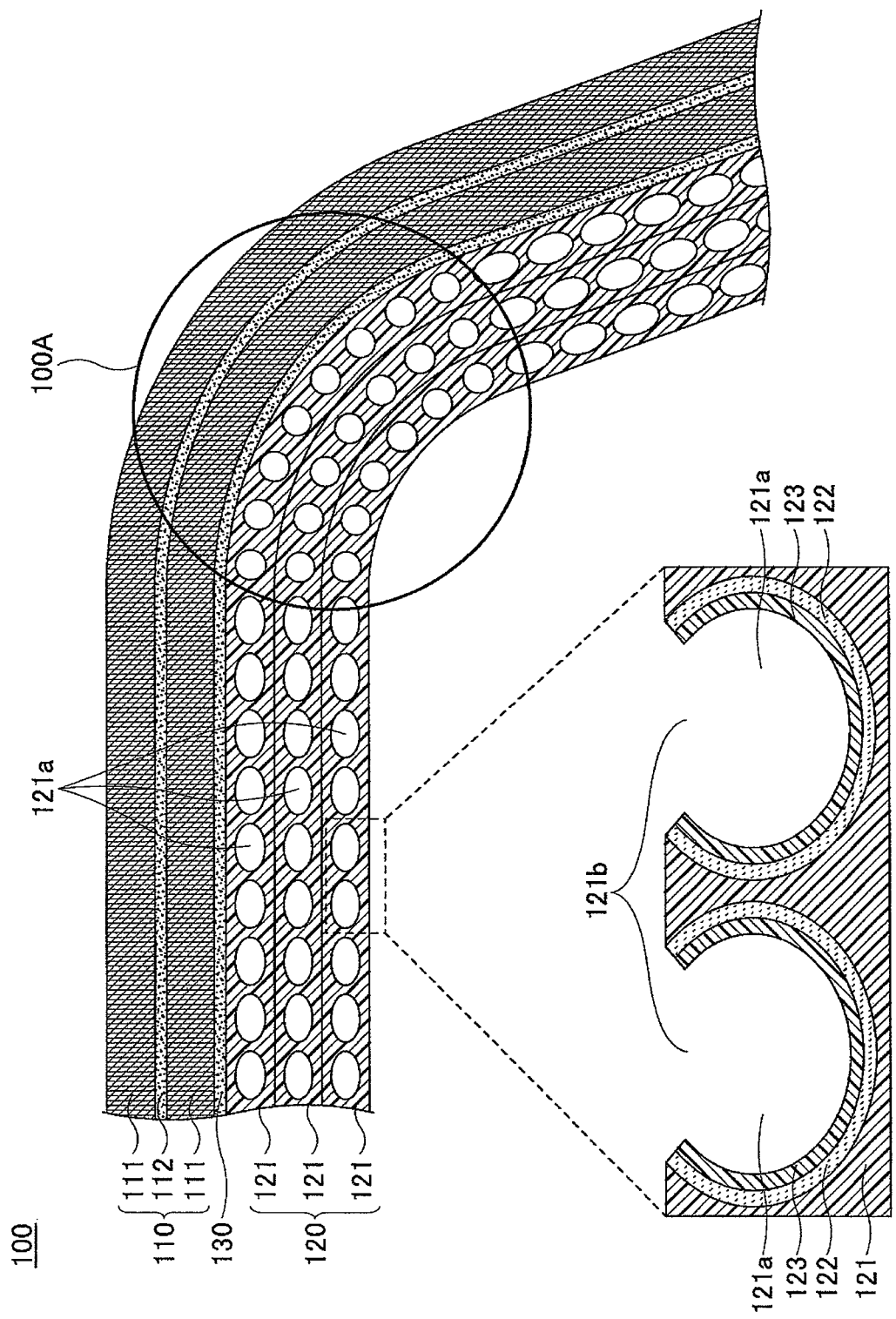
FIG. 3 is a cross sectional view illustrating an example of a housing in a first embodiment.

A description will be given of a plate member and a processed member pressed therefrom, by referring to FIG. 3. FIG. 3 is a cross sectional view illustrating an example of a housing in a first embodiment. For example, a processed member may be used for a housing of various electronic equipments, such as a calculator, a portable telephone, a PDA, and a PC. In the following description, it is assumed for the sake of convenience that the processed member is used for a housing 100 of an electronic equipment. The housing 100 may accommodate components or parts of the electronic equipment.

As illustrated in FIG. 3, the housing 100 includes a wood part 110, and a resin part 120 bonded to a surface of the wood part 110 opposite to a finishing or armored surface on the outer side of the wood part 110. The wood part 110 and the resin part 120 may be bonded via an adhesive agent 130, such as a starch-based thermosetting adhesive agent. The wood part 110 includes one or a plurality of wood plates 111, and the resin part 120 includes one or a plurality of resin sheets 121. In this example, the wood part 110 includes two wood plates 111, and the resin part 120 includes three resin sheets 121. When a plurality of wood plates 111 are used for the wood part 110, the plurality of wood plates 111 may be mutually bonded via an adhesive agent 112. When a plurality of resin sheets 121 are used for the resin part 120, the plurality of resin sheets 121 may be mutually bonded directly using the adhesive properties thereof as illustrated in FIG. 3 or, may be bonded via an adhesive agent (not illustrated).

Each wood plate 111 may have a thickness in a range of 100 μm to 700 μm from the point of view of workability by pressing, although this thickness may depend on the kind of wood used or the thickness required of the housing 100. For example, each wood plate 111 may be Japanese cryptmeria having a thickness of 200 μm or 500 μm.

Each resin sheet 121 may be an ABS (Acrylonitrile Butadiene Styrene) resin sheet having a thickness of 200 μm, for example. Of course, a porous resin sheet using a material such as polypropylene, polystyrene, polyethylene, PVC (Poly-Vinyl Chloride), and PMMA (Poly-Methyl Metha-Crylate) may be used in place of the ABS sheet.

Each resin sheet 121 includes a plurality of pores 121a, in the form of bubbles, formed inside the resin sheet 121. Hence, the resin sheet 121 may hereinafter also be referred to as a "porous resin sheet" 121. The pores 121a of the resin sheet 121 may or may not penetrate the resin sheet 121. As illustrated in a bottom left portion of FIG. 3 on an enlarged scale, each pore 121a may extend to one surface of the resin sheet 121 to form an opening 121b to the surface of the resin sheet 121, in order to enable coating of an inner wall of the pore 121a. For example, each pore 121a may have a pore diameter on the order of 80 μm, and the pores 121a may be arranged at a pitch on the order of 100 μm. A honeycomb film manufactured by Fujifilm Corporation, for example, may be used for such a resin sheet having pores that form an opening at the surface of the resin sheet.

The housing 100 includes a curved part 100A that is formed by pressing. Generally, stress is likely to concentrate at the curved part. However, in this embodiment, the resin part 120 including the porous resin sheets 121 may disperse the stress by contraction or deformation of the pores 121a. In addition, even if the wood plate 111 includes parts with locally different qualities, such as gnarls having a high density and brittleness, the pores 121a in the porous resin sheets 121 of the resin part 120 may suppress cracks or warps from being generated from such parts. Furthermore, the effect of dispersing the stress by the contraction or deformation of the pores 121a is maintained even after the housing 100 is used to assemble the electronic equipment or the like.

An inner wall defining each pore 121a in the resin sheet 121 may include a flame retardant (or a fire-resistant agent) 122 and/or a remover 123. The flame retardant 122 and/or the remover 123 may be formed on the inner wall defining each pore 121a by impregnation or coating, as will be described later.

The flame retardant 122 acts as a flame retardant film or a fire-resistant layer, in order to make the resin sheet 121 and thus the housing 100 fire-resistant. Hence, due to the fire-resistant property of the flame retardant 122, the resin sheet 121 that is integrally formed on the housing 100 may function as a cover (or heat countermeasure part) for a heat generating element (or heater element) existing inside the electronic equipment that uses the housing 100, in order to eliminate the need to provide a separate part, such as a fire-resistant enclosure, for the heat generating element. For example, a phosphor-based flame retardant may be used for the flame retardant 122. Depending on the fire-resistant standard the electronic equipment using the housing 100 is required to satisfy, the wood plate 111 may be impregnated or coated with a flame retardant.

The remover 123 acts as an adhesion preventing film to prevent adhesion of the inner walls defining the pores 121a or, a bonding preventing layer to prevent bonding of the inner walls defining the pores 121a. Hence, even if the pores 121a collapse, the inner walls of the collapsed pores 121a are prevented from adhering or bonding to each other by the provision of the remover 123. Otherwise, the resin sheet 121 may locally cave in due to unwanted adhesion or bonding of the inner walls of the collapsed pores 121a. Accordingly, even when the pores 121a temporarily undergo excessive deformation at the curved part 100A, the shape of the resin sheet 121 may recover and improve the flatness of the shape formed by the pressing. For example, Teflon (registered trademark) manufactured by DuPont may be used for the remover 123.

As described heretofore, the housing 100 has a composite stacked structure including the wood part 110 and the resin part 120. Compared to a case in which the strength required by the housing 100 is realized solely by a wood material, the wood part 110 may be made thinner and more flexible. For this reason, the housing 100 may undergo bends or deformation within a stress range that does not reach shear stress. In addition, because the stress may be dispersed by the resin part 120, the generation of a break and/or warp at the curved part 100A or the locally uneven parts of the wood part 110 may be suppressed. Consequently, the yield of the housing 100 may be improved.

On the other hand, the flame retardant 122 on the inner walls defining the pores 121a in the resin part 120 may provide, to the housing 100 itself, the fire-resistant property that is required by the electronic equipment. In addition, the large number of pores 121a in each resin sheet 121 of the resin part 120 may enable the housing 100 to be light in weight.

Next, a description will be given of an example of a method of fabricating the housing 100, by referring to FIGS. 4A through 4E. FIGS. 4A through 4E are diagrams for explaining the example of the method of fabricating the housing in the first embodiment.

Figure 4A:
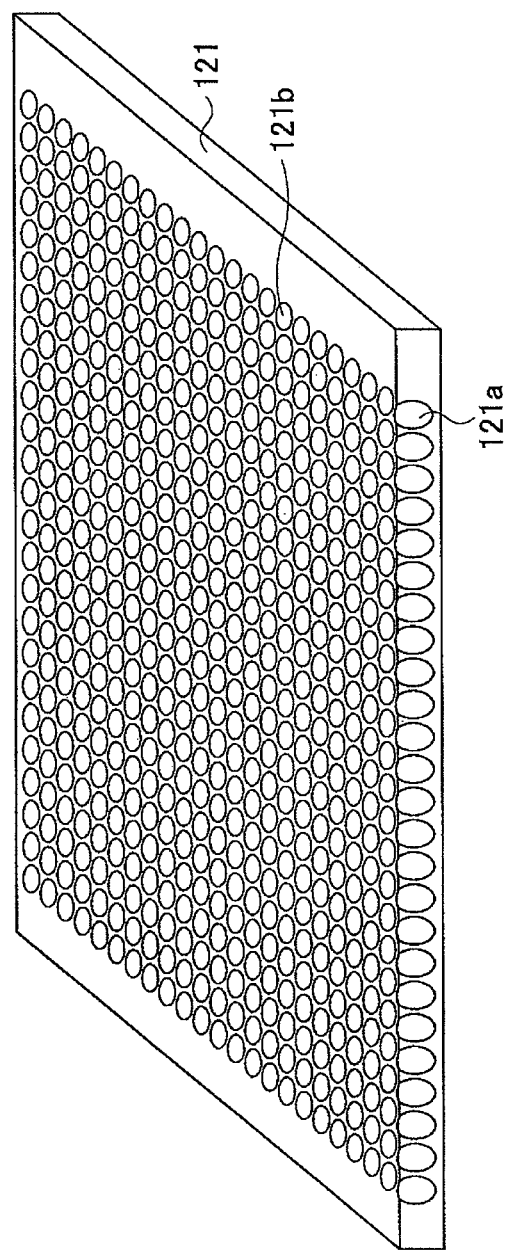

First, the wood plates 111 described above, and the porous resin sheets 121 having the large number of pores 121a as illustrated in a plan view in FIG. 4A, are prepared. In this example, the pores 121a are in a semi-open state in which the pores 121a open to a top surface of the resin sheet 121 via openings 121b, but the pores 121a are closed at a bottom surface of the resin sheet 121.

Figure 4B:
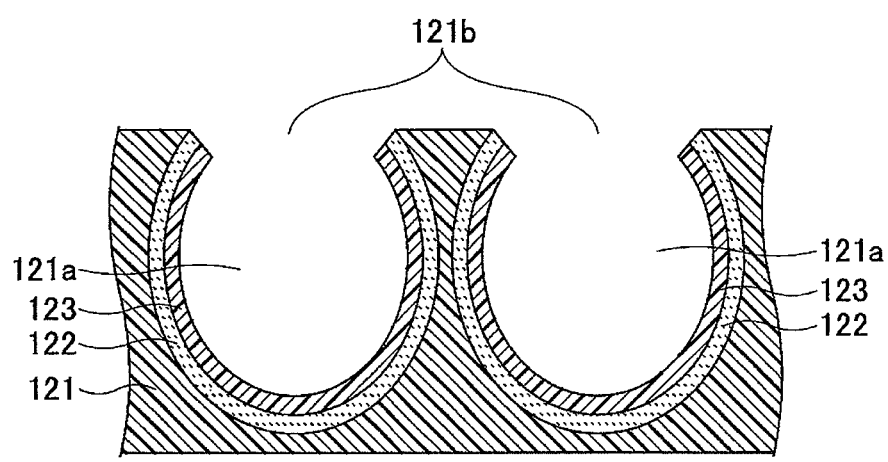

Next, as illustrated on an enlarged scale in a cross section in FIG. 4B, a film of a flame retardant 122 and/or a remover 123 may be formed on the inner walls of the pores 121a, if necessary. For example, the flame retardant 122 and/or the remover 123 may be formed by dipping using a dipping apparatus or, by coating using a screen printing apparatus. For the sake of convenience, the illustration of the flame retardant 122 and the remover 123 will be omitted in FIG. 4C and the subsequent figures.

Figure 4C:
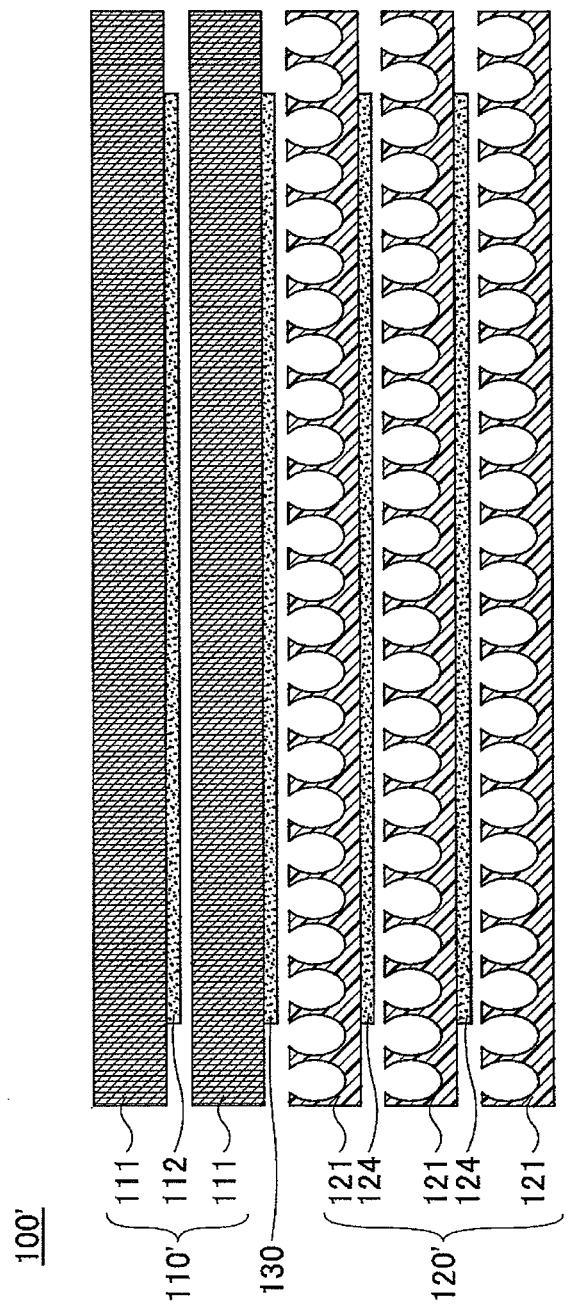

Next, as illustrated in a cross section in FIG. 4C, a wood part 110' and a resin part 120' are stacked via the adhesive agent 130. The wood part 110' includes a desired number of stacked wood plates 111, and the resin part 120' includes a desired number of stacked resin sheets 121. In this example, the wood part 110' includes two stacked wood plates 111, and the resin part 120' includes three stacked resin sheets 121. The two wood plates 111 are bonded via an adhesive agent 112, and two mutually adjacent resin sheets 121 are bonded via an adhesive agent 124. As a result, a provisionally stacked structure 100' is formed. A top surface of the uppermost wood plate 111 of the provisionally stacked structure 100' forms to a finishing or armored surface of the housing 100. In other words, the uppermost wood plate 111 corresponds to a decorative sheet or board of the housing 100.

The wood plate 111 may be impregnated or coated with a flame retardant prior to being stacked in the provisionally stacked structure 100', if necessary.

Next, as illustrated in a cross section in FIG. 4D, the provisionally stacked structure 100' is set between a pair of form dies, that is, a female die 150-1 and a male die 150-2. The dies 150-1 and 150-2 are shaped in order to obtain the desired shape of the housing 100. Prior to setting the provisionally stacked structure 100' between the dies 150-1 and 150-2, the provisionally stacked structure 100' may be subjected to a softening process using steam for 10 seconds, for example, in order to soften the provisionally stacked structure 100'. In this example, the wood part 110' is arranged on the side of the female die 150-1 and the resin part 120' is arranged on the side of the male die 150-2, however, the arrangement of the provisionally stacked structure 100' with respect to the dies 150-1 and 150-2 may be changed if necessary depending on whether the decorative surface of the housing 100 to be fabricated includes an outwardly curving shape or an inwardly curving shape.

Next, as illustrated on an enlarged scale in a cross section in FIG. 4E, the provisionally stacked structure 100' is pressed by the dies 150-1 and 150-2. The pressing condition may depend on the kind of wood used for the wood plates 11 and/or the thickness of the wood plates 11. For example, the die temperatures may be set so that the wood part 110' is heated to 130° C. and the resin part 120' is heated to 90° C., the forming pressure may be set to 9 MPa, and the pressing in which the pressing is carried out for 1 second and then released for 3 seconds may be repeated for a total pressing time of 5 minutes.

During the pressing, the stress may be dispersed by the pores 121a in the resin part 120, as described above. Hence, the crack and warp may be suppressed even at the curved part 100A where the stress is likely to concentrate. In addition, in a case in which the wood part 110 includes a plurality of wood plates 111, the plurality of wood plates 111 slide relative to each other at the curved part 100A, and the effect of dispersing the stress may be increased and the forming accuracy of the curvature of the curved part 100A may be improved compared to the case in which the wood part 110 is formed by a single wood plate 111.

Figure 1D:
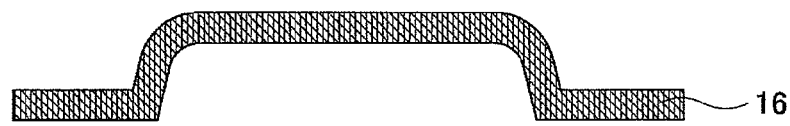
Figure 1E:
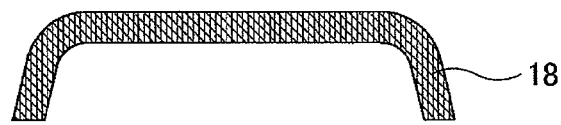
Figure 1F:
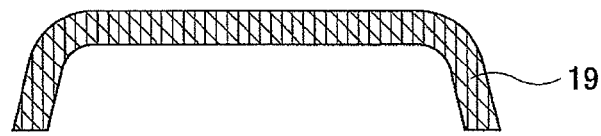
Figure 2:
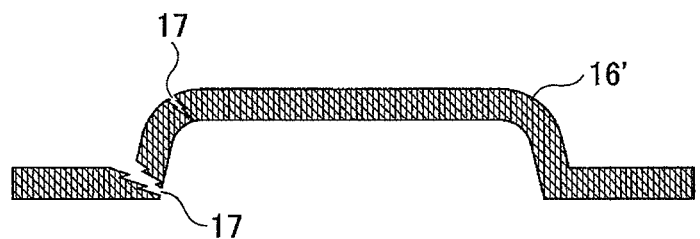
FIG. 2 is a cross sectional view for explaining a split or crack generated at a curved part of a workpiece.

After the pressing, the dies 150-1 and 150-2 are separated, and a chamfering similar to that described above in conjunction with FIGS. 1D and 1E may be carried out, in order to complete the housing 100.

Second Embodiment

Figure 5:
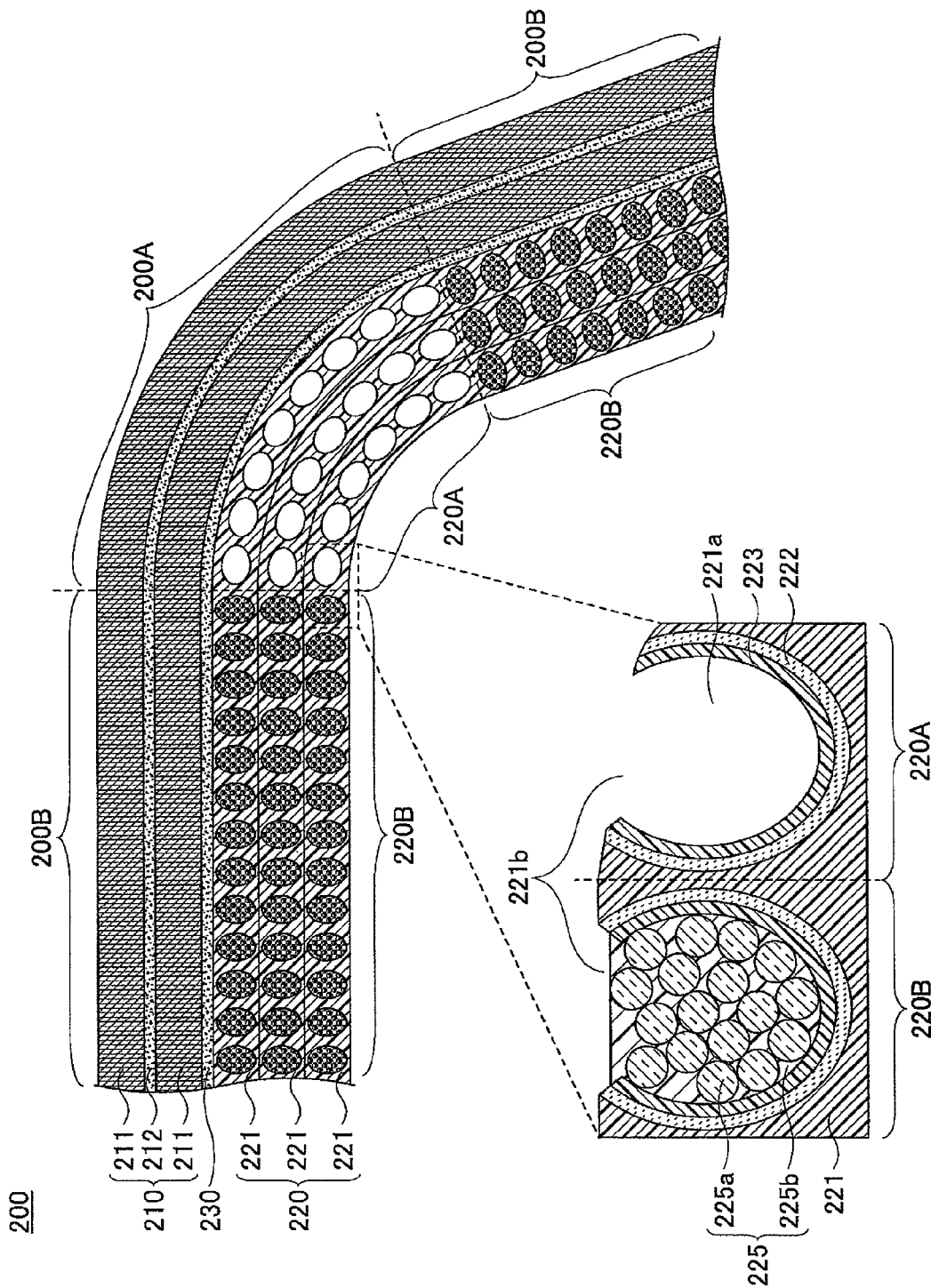
FIG. 5 is a cross sectional view illustrating an example of the housing in a second embodiment.

Next, a description will be given of the plate member in a second embodiment and a processed member obtained by pressing the plate member, by referring to FIG. 5. FIG. 5 is a cross sectional view illustrating an example of the housing in the second embodiment. For example, a processed member 200 may form a housing of an electronic equipment, and thus, the processed member will hereinafter be referring to as a "housing" 200. The housing 200 may include elements common to the housing 100 of the first embodiment. Thus, those parts in FIG. 5 that are the same as those corresponding parts in FIG. 3 will be described by the same reference numerals, and a description thereof will be omitted.

As illustrated in FIG. 5, the housing 200 includes a wood part 210, and a resin part 220 bonded to a surface of the wood part 210 opposite to a finishing or armored surface on the outer side of the wood part 210. The wood part 210 and the resin part 220 may be bonded via an adhesive agent 230. The wood part 210 includes one or a plurality of wood plates 211, and the resin part 220 includes one or a plurality of resin sheets 221. In this example, the wood part 210 includes two wood plates 211, and the resin part 220 includes three resin sheets 221. When a plurality of wood plates 211 are used for the wood part 210, the plurality of wood plates 211 may be mutually bonded via an adhesive agent 212. When a plurality of resin sheets 221 are used for the resin part 220, the plurality of resin sheets 221 may be mutually bonded directly using the adhesive properties thereof as illustrated in FIG. 5 or, may be bonded via an adhesive agent (not illustrated).

The housing 200 includes a curved part 200A formed by pressing, and a flat part 200B. The resin part 220 includes a curved resin part 220A corresponding to the curved part 200A of the housing 200, and a flat resin part 220B corresponding to the flat part 200B of the housing 200.

Each resin sheet 221 includes a plurality of pores 221a, in the form of bubbles, formed inside the resin sheet 221. Hence, the resin sheet 221 may hereinafter also be referred to as a "porous resin sheet" 221. The pores 221a of the resin sheet 221 may or may not penetrate the resin sheet 221. As illustrated in a bottom left portion of FIG. 5 on an enlarged scale, each pore 221a may extend to one surface of the resin sheet 221 to form an opening 221b to the surface of the resin sheet 221. A flame retardant 222 and/or a remover 223 may be formed on inner walls of the pores 221a. For example, each pore 221a may have a pore diameter on the order of 80 μm, and the pores 221a may be arranged at a pitch on the order of 100 μm.

The pores 221a of the flat resin part 220B are filled with a flame retardant filler 225. On the other hand, the pores 221a of the curved resin part 220A are not filled with the flame retardant filler 225 and are maintained in the hollow or empty state. For example, the flame retardant filler 225 may include a lightweight filler made of glass, inorganic material, or the like. In this example, the flame retardant filler 225 includes a cellular glass filler 225a within a resin 225b. The cellular glass filler 225a may be used as an additive to various resin paints, and is useful in that it is lightweight, provides heat insulation, and maintains stable dimensions with respect to heat. An example of the flame retardant filler 225 may include 10 wt % of "glass bubbles S60HS" manufactured by 3M having spherical grain diameter of 27 μm, as the cellular glass filler 225a, within 5 wt % of PVA (Poly-Vinyl Alcohol) resin and 85 wt % of IPA (Iso-Propyl Alcohol), as the resin 225b. The flame retardant filler 225 including the cellular glass filler 225a (and the resin 225b) is backed after being filled into the pores 221a in the flat resin part 220B. Other materials including inorganic materials, such as porous carbon materials and porous ceramics (alumina, silica, mullite), and porous resins including pores, may also be used for the flame retardant filler 225.

In the single housing 200 having the stacked structure formed by the wood part 210 and the resin part 220, the structure of the resin part 220 is made different between the curved part 200A and the flat part 200B, in order to obtain the following effects. In the curved part 200A of the housing 200, the pores 221a of the curved resin part 220A are hollow, and thus, the pores 221a may freely deform to release the stress depending on the extent of the curve (or bend) of the curved part 200A. In other words, the curved part 200A is sufficiently flexible and deformable, and may reduce the stress of the deforming. Hence, the generation of the crack at the curved part 200A and the deformation or warp after the pressing may be suppressed, in a manner similar to the first embodiment described above. On the other hand, in the flat part 200B of the housing 200, the flame retardant filler 225 fills the pores 221a of the flat resin part 220B, and the flame retardant filler 225 acts as a reinforcing material to help maintain the flat shape of the flat part 200B to a certain extent. In other words, the flat part 200B may be sufficiently rigid and be uneasily deformable. For this reason, the flatness of the flat part 200B may be maintained at the time of the pressing and after the housing 200 is used for a relatively long period of time, and the decorative feature of the wood grain may be maintained at the decorative surface of the housing 200. In addition, the thickness of the resin part 220 and thus the thickness of the housing 200 may be reduced while maintaining a desired strength (or rigidity), if necessary.

Moreover, the housing 200 itself may be made fire-resistant as required by the electronic equipment, by using a flame retardant filler 225 or, by using the flame retardant filler 225 and the flame-retardant film 222 and/or a flame retardant impregnated into the wood part 210.

In FIG. 5, all of the pores 221a within the curved resin part 220A are hollow, and all of the pores 221a within the flat resin part 220B are filled with the flame retardant filler 225. However, the pores 221a of the resin part 220 may be partially filled with flame retardant filler 225, if necessary. For example, some of the pores 221a within the curved resin part 220A may be filled by a filler, in order to improve the fire resistance of and/or reinforce the curved resin part 220A. On the other hand, some of the pores 221a within the flat resin part 220B may be hollow, in order to suppress the generation of a crack and/or a warp at uneven parts where the wood quality is uneven, even when such even parts locally exist in the wood plates 211. Hence, in a single resin sheet 221, pores 221a filled with the flame retardant filler 225 and hollow pores 221a may be distributed within the curved resin part 220A. On the other hand, the pores 221a of one of the resin sheets 221 closest to the heat generating element of the electronic equipment may be filled with the flame retardant filler 225, while the pores 221a of the other resin sheets 221 further away from the heat generating element and thus closer to the wood part 210 may be hollow.

Next, a description will be given of an example of the method of fabricating the housing 200, by referring to FIGS. 6A through 6I. FIGS. 6A through 6I are diagrams for explaining the example of the method of fabricating the housing in the second embodiment.

First, the wood plates 211 described above, and porous resin sheets 221' having a large number of pores 221a as illustrated in a perspective view in FIG. 6A, are prepared. In this example, the pores 221a are in a semi-open state in which the pores 221a open to a top surface of the resin sheet 221' via openings 221b, but the pores 221a are closed at a bottom surface of the resin sheet 121'. However, the pores 221a may open to both the top and bottom surfaces of the resin sheet 221'. In other words, the pores 221a need only be open to at least one of the top and bottom surfaces of the resin sheet 221'. As described above in conjunction with FIG. 4B with respect to the first embodiment, the inner walls defining the pores 221a may be impregnated or coated with a flame retardant and/or a remover, if necessary.

Figure 6B:
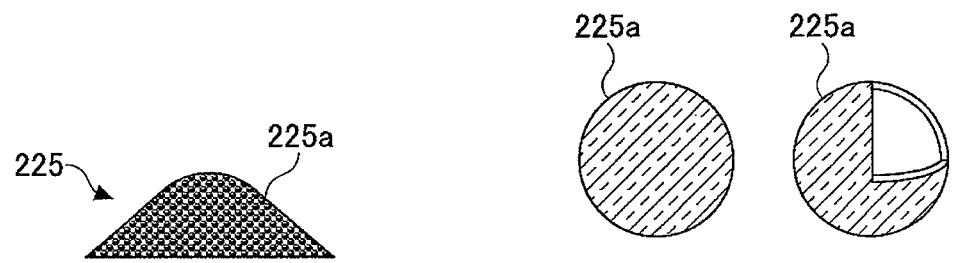

In addition, a filler paste 225A including cellular glass fillers 225a illustrated in FIG. 6B is prepared. As illustrated on an enlarged scale on the right portion of FIG. 6B, each cellular glass filler 225a has a spherical shape.

Figure 6C:
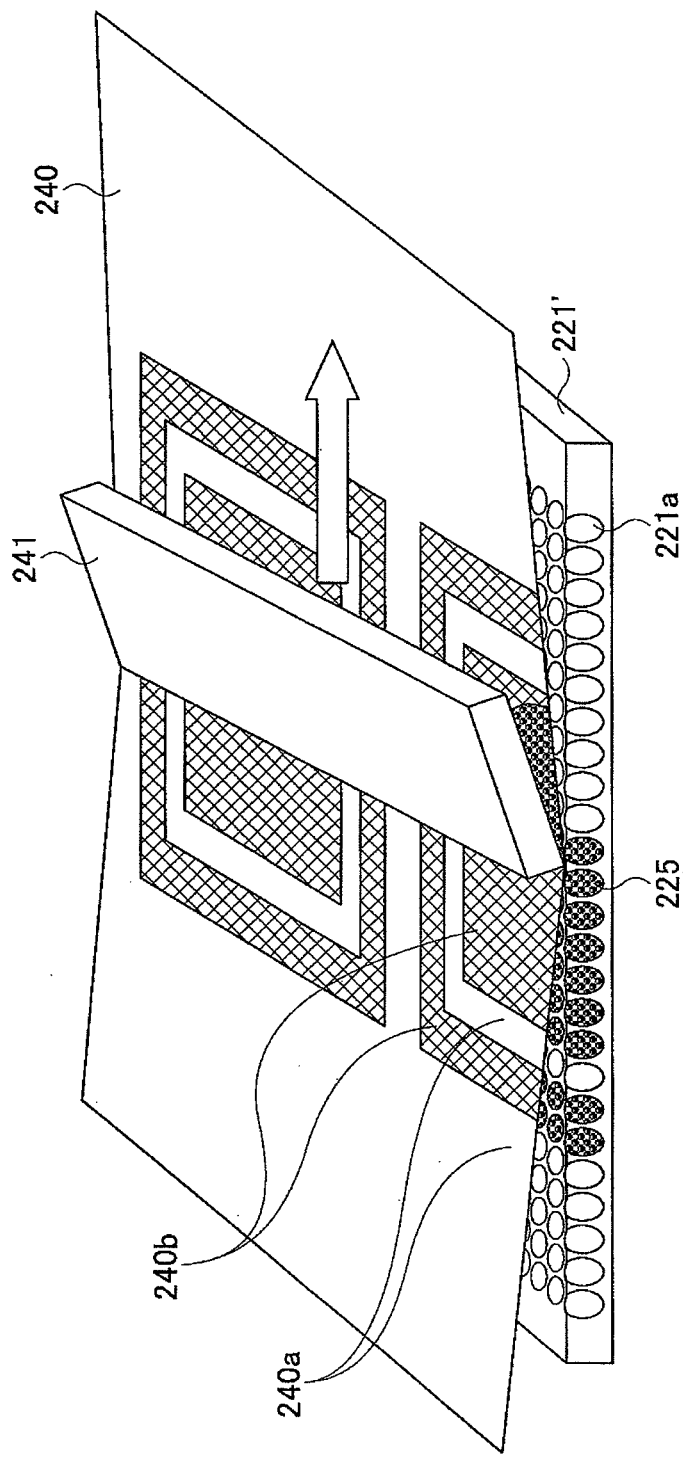

Next, as illustrated in a perspective view in FIG. 6C and in a cross section in FIG. 6D, a screen mask 240 having a predetermined pattern is set on the porous resin sheet 221', and a screen printing is carried out to print the filler paste 225A using a squeezee 241. The pores 221a located under a mask part 240a of the screen mask 240 are not filled by the filler paste 225A and remain in the empty, hollow state. On the other hand, the pores 221a located under a mesh part (or opening part) 240b of the screen mask 240 are selectively filled by the filler paste 225A, via the openings 221b in the resin sheet 221', to form the flame retardant filler 225. In the pattern of the screen mask 240, the mask part 240a corresponds to a resin sheet part 221A forming a curved part 220A which will be described later, and the mesh part 240b corresponds to a resin sheet part 221B forming a flat part 220B which will be described later.

After the screen printing, a baking process is carried out within a constant temperature oven, in order to obtain a filler-including resin sheet 221 having patterns 221A and 221B in accordance with the pattern of the screen mask 240, as illustrated in a perspective view in FIG. 6E. The pores 221a in the pattern 221B are filled by the flame retardant filler 225 including the cellular glass filler 225a.

Next, as illustrated in a perspective view in FIG. 6F, a wood part 210' and a resin part 220' are stacked via the adhesive agent 230. The wood part 210' includes a desired number of stacked wood plates 211, and the resin part 220' includes a desired number of stacked resin sheets 221. In this example, the wood part 210' includes two stacked wood plates 211, and the resin part 220' includes three stacked resin sheets 221. The two wood plates 211 are bonded via an adhesive agent 212, and two mutually adjacent resin sheets 221 may be bonded via an adhesive agent. As a result, a provisionally stacked structure 200' is formed. A top surface of the uppermost wood plate 211 of the provisionally stacked structure 200' forms to a finishing or armored surface of the housing 200. In other words, the uppermost wood plate 211 corresponds to a decorative sheet or board of the housing 200.

FIG. 6G is a cross section illustrating a region C of the provisionally stacked structure 200' on an enlarged scale. In this example, the flame retardant filler 225 including the cellular glass filler 225a fills each of the resin sheets 221 with the same pattern. The resin sheet parts 221A in which the pores 221a are not filled by the flame retardant filler 225 are aligned when stacking the resin sheets 221. The resin sheet part 221A forms a curved resin part 220A' of the resin part 220', corresponding to the curved part 220A of the resin part 220. Similarly, the resin sheet parts 221B in which the pores 221a are filled by the flame retardant filler 225 are aligned when stacking the resin sheets 221. The resin sheet part 221B forms a flat resin part 220B' of the resin part 220', corresponding to the flat part 220B of the resin part 220.

Figure 6H:
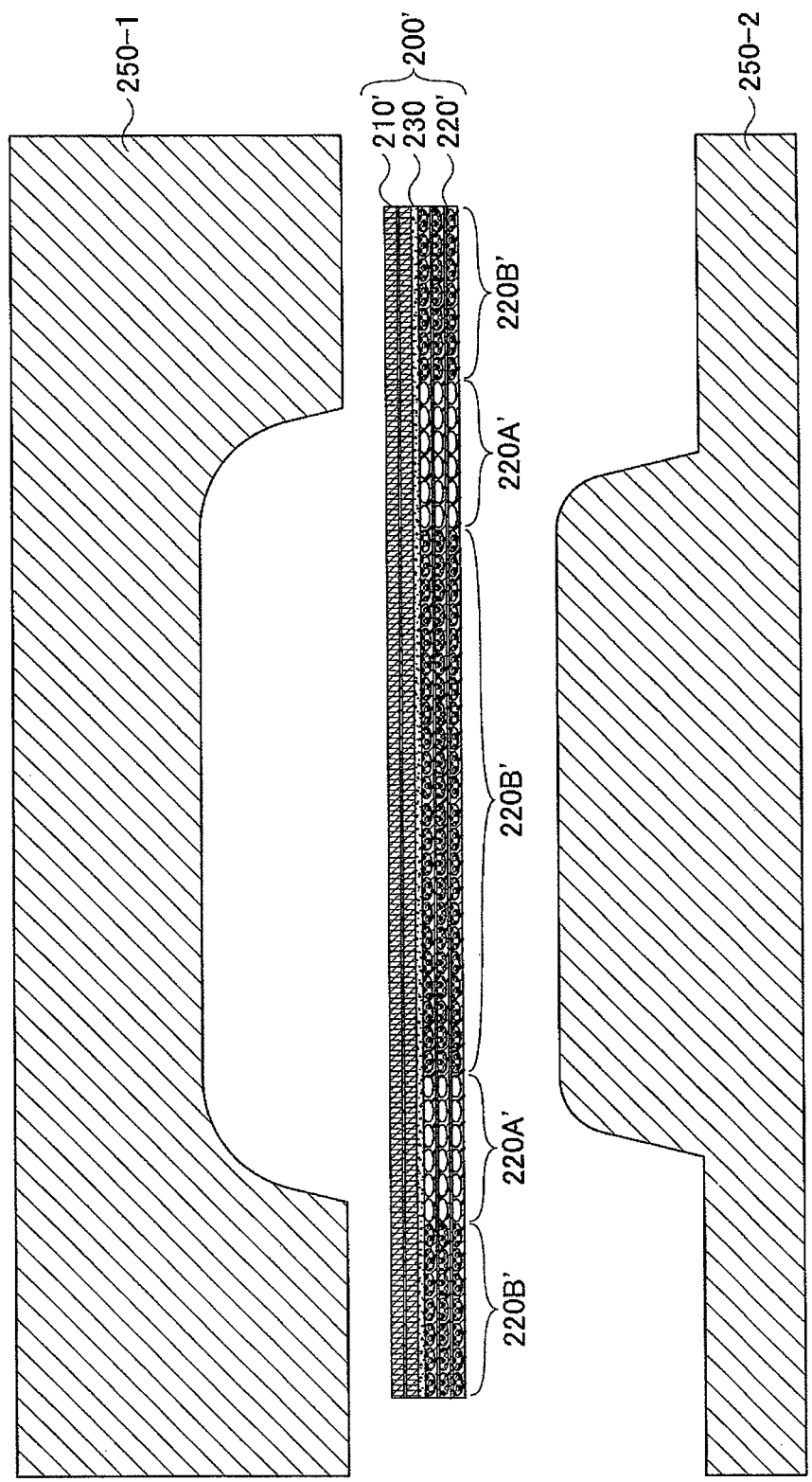

Next, as illustrated in a cross section in FIG. 6H, the provisionally stacked structure 200' is set between a pair of form dies, that is, a female die 250-1 and a male die 250-2. The dies 250-1 and 250-2 are shaped in order to obtain the desired shape of the housing 200. When setting the provisionally stacked structure 200' between the dies 250-1 and 250-2, the curved resin part 220A' is aligned or positioned in order to oppose a curved region of each of the dies 250-1 and 250-2, and the flat resin part 220B' is aligned or positioned in order to oppose a flat region of each of the dies 250-1 and 250-2.

Prior to setting the provisionally stacked structure 200' between the dies 250-1 and 250-2, the provisionally stacked structure 200' may be subjected to a softening process using steam for 10 seconds, for example, in order to soften the provisionally stacked structure 200'. In this example, the wood part 210' is arranged on the side of the female die 250-1 and the resin part 220' is arranged on the side of the male die 250-2, however, the arrangement of the provisionally stacked structure 200' with respect to the dies 250-1 and 250-2 may be changed if necessary depending on whether the decorative surface of the housing 200 to be fabricated includes an outwardly curving shape or an inwardly curving shape.

Figure 6I:
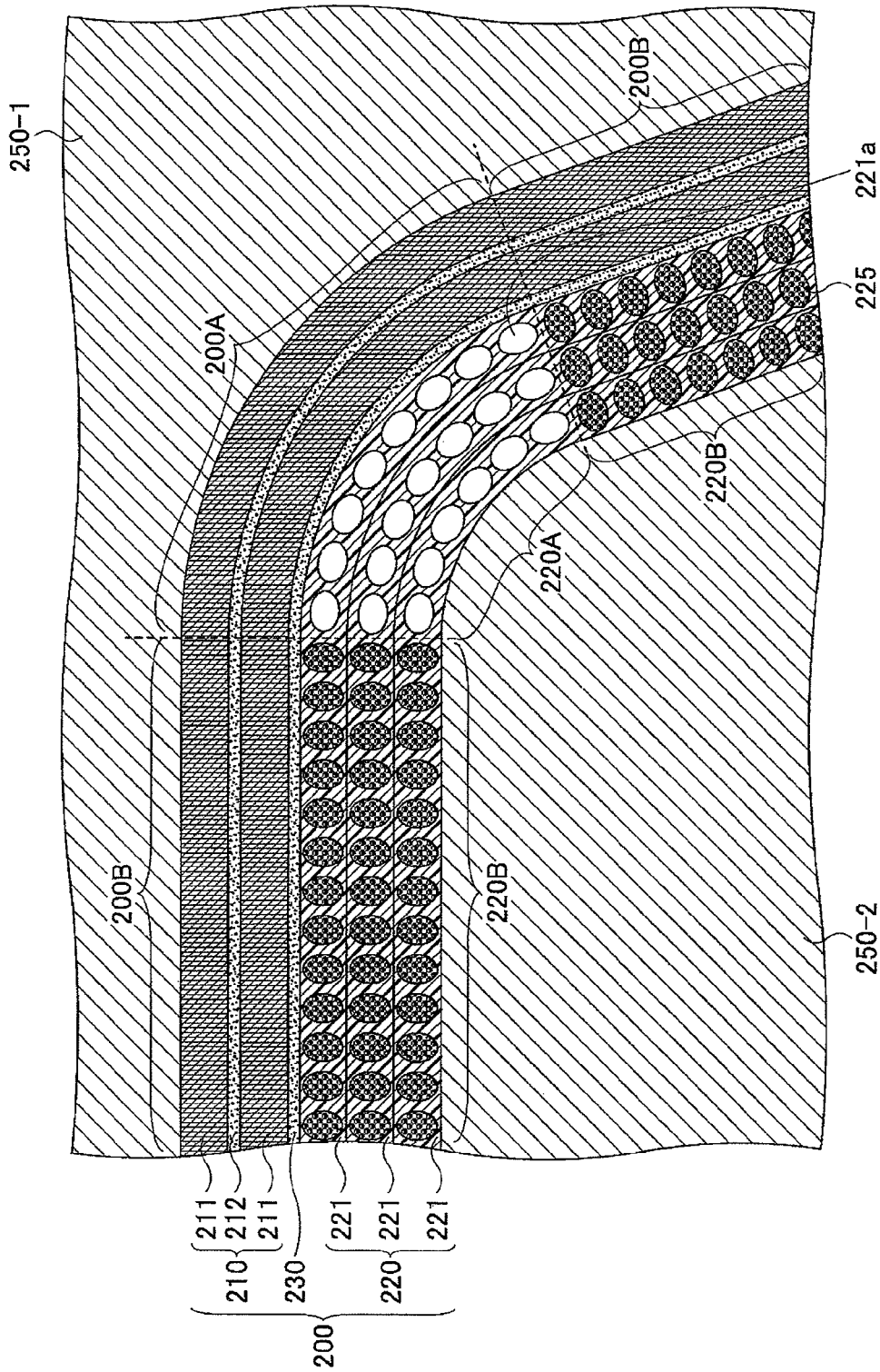

Next, as illustrated on an enlarged scale in a cross section in FIG. 6I, the provisionally stacked structure 200' is pressed by the dies 250-1 and 250-2, in order to form the curved part 200A and the flat part 200B. The pressing condition may be similar to the pressing condition used in the first embodiment described above. For example, the die temperatures may be set so that the wood part 210' is heated to 130° C. and the resin part 220' is heated to 90° C., the forming pressure may be set to 9 MPa, and the pressing in which the pressing is carried out for 1 second and then released for 3 seconds may be repeated for a total pressing time of 5 minutes.

During the pressing, the stress may be dispersed by the pores 221a in the curved resin part 220A of the curved part 200A, as described above. Hence, the crack and warp may be suppressed even at the curved part 200A where the stress is likely to concentrate. On the other hand, because the pores 221a in the flat resin part 220B of the flat part 200B are filled with the filter paste 225A, the shape of the flat part 200B may be maintained stable.

After the pressing, the dies 250-1 and 250-2 are separated, and a chamfering similar to that described above in conjunction with FIGS. 1D and 1E may be carried out, in order to complete the housing 200.

Third Embodiment

Next, a description will be given of the plate member in a third embodiment and a processed member obtained by pressing the plate member, by referring to FIG. 7. FIG. 7 is a cross sectional view illustrating an example of the housing in the third embodiment. For example, a processed member 300 may form a housing of an electronic equipment, and thus, the processed member will hereinafter be referring to as a "housing" 300. The housing 300 may include elements common to the housing 100 of the first embodiment and the housing 200 of the second embodiment. Thus, those parts in FIG. 7 that are the same as those corresponding parts in FIGS. 3 and 5 will be described by the same reference numerals, and a description thereof will be omitted.

As illustrated in FIG. 7, the housing 300 includes a wood part 310, and a resin part 320 bonded to a surface of the wood part 310 opposite to a finishing or armored surface on the outer side of the wood part 310. The wood part 310 and the resin part 320 may be bonded via an adhesive agent 330. The wood part 310 includes one or a plurality of wood plates 311, and the resin part 320 includes one or a plurality of resin sheets 321. In this example, the wood part 310 includes two wood plates 311, and the resin part 320 includes three resin sheets 321. When a plurality of wood plates 311 are used for the wood part 310, the plurality of wood plates 311 may be mutually bonded via an adhesive agent 312. When a plurality of resin sheets 321 are used for the resin part 320, the plurality of resin sheets 321 may be mutually bonded directly using the adhesive properties thereof as illustrated in FIG. 7 or, may be bonded via an adhesive agent (not illustrated).

The housing 300 includes a curved part 300A formed by pressing, and a flat part 300B. The resin part 320 includes a curved resin part 320A corresponding to the curved part 300A of the housing 300, and a flat resin part 320B corresponding to the flat part 300B of the housing 300.

Each resin sheet 321 includes a plurality of pores 321*a*, in the form of bubbles, formed inside the resin sheet 321 in the curved resin part 320A. Each pore 321*a* may have shape similar to that of the pore 121*a* of the housing 100 described above in conjunction with the first embodiment. For example, each pore 321*a* may have a pore diameter on the order of 80 μm, and the pores 321*a* may be arranged at a pitch on the order of 100 μm. A flame retardant and/or a remover may be formed on inner walls of the pores 321*a*, in a manner similar to the pores 121*a* of the housing 100. However, the pores 321*a* are not formed in the flat resin part 320B of each of the resin sheets 321.

In the single housing 300 having the stacked structure formed by the wood part 310 and the resin part 320, the structure of the resin part 320 is made different between the curved part 300A and the flat part 300B in order to obtain the following additional effects. In the curved part 300A of the housing 300, the pores 321*a* in the resin part 320A may freely deform and release the stress depending on the extent of the curve (or bend) of the curved part 300A. For this reason, the generation of the crack at the curved part 300A and the deformation or warp after the pressing may be suppressed, in a manner similar to the first and second embodiments described above. On the other hand, in the flat part 300B of the housing 300, the flat shape of the flat part 300B may be maintained to a certain extent because the resin part 320 includes no pores 321*a* in the flat resin part 320B. In other words, the flat part 300B may be sufficiently rigid and be uneasily deformable. For this reason, the flatness of the flat part 300B may be maintained at the time of the pressing and after the housing 300 is used for a relatively long period of time, and the decorative feature of the wood grain may be maintained at the decorative surface of the housing 300. In addition, the thickness of the resin part 320 and thus the thickness of the housing 300 may be reduced while maintaining a desired strength (or rigidity), if necessary.

Although the resin part 320 includes no pores 321*a* in the flat resin part 320B in FIG. 7, the flat resin part 320 may include pores having a pore diameter smaller than that of the pores 321*a* within the curved resin part 320A and/or pores arranged at a density that is more coarse than that of the pores 321*a* within the curved resin part 320A. For example, only some of the resin sheets 321 may include the pores 321*a*. By forming the pores 321*a* within the flat resin part 320B, and impregnating or coating a flame retardant on the side walls defining the pores 321*a* within the flat resin part 320B, the fire resistance of and/or reinforce the flat resin part 320B may be improved.

Next, a description will be given of an example of a method of fabricating the resin sheet 321 partially formed with the pores 321*a*, which may be used to fabricate the housing 300, by referring to FIGS. 8A through 8D. FIGS. 8A through 8D are perspective views for explaining the example of the method of forming the resin sheet partially formed with pores.

Figure 8A:
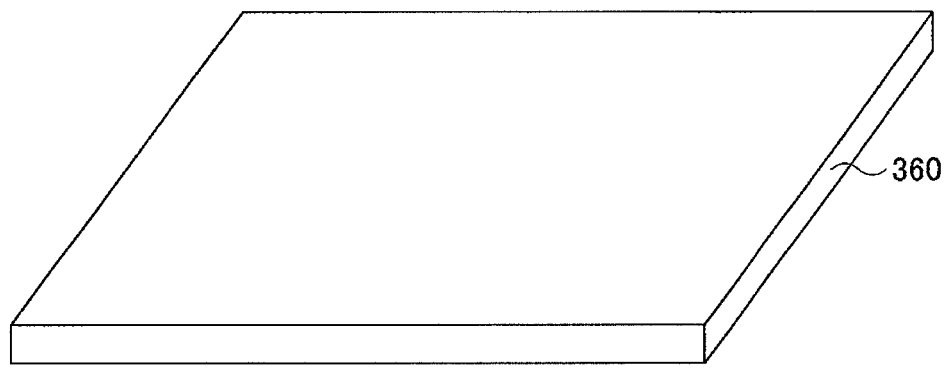
FIGS. 8A through 8D are perspective views for explaining an example of a method of forming a resin sheet partially formed with pores.
Figure 8B:
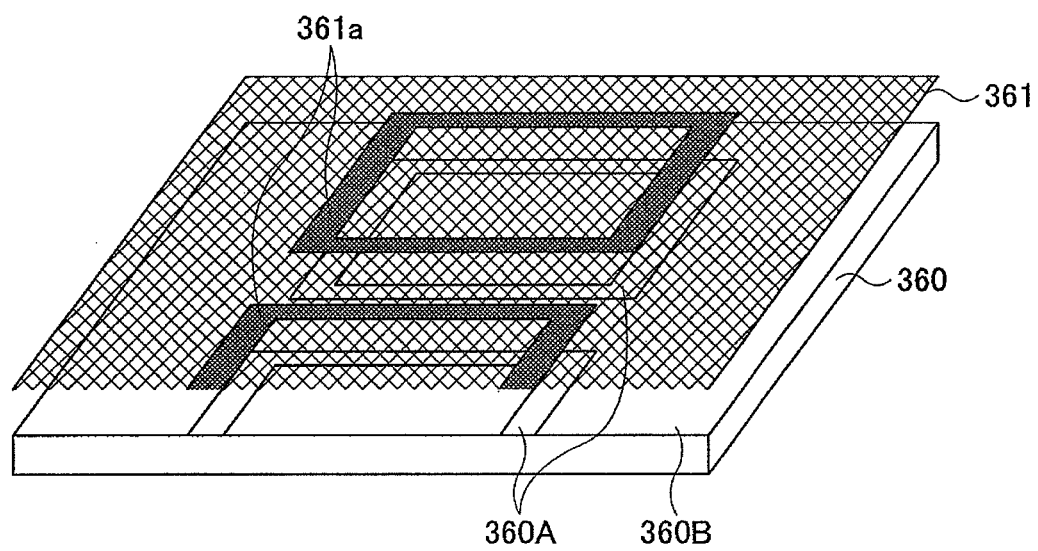

First, as illustrated in FIG. 8A, a water repellent sheet 360 is prepared. Then, as illustrated in FIG. 8B, an exposure and hydrophilic process is carried out using a mask 361. The mask 361 includes a mask part 361*a* having a pattern corresponding to the curved part 300A of the housing 300. A region 360A of the water repellent sheet 360 masked by the mask part 361*a* remains water repellent, while a region 360B of the water repellent sheet 360 not masked by the mask part 361*a* changes and becomes hydrophilic.

Figure 8C:
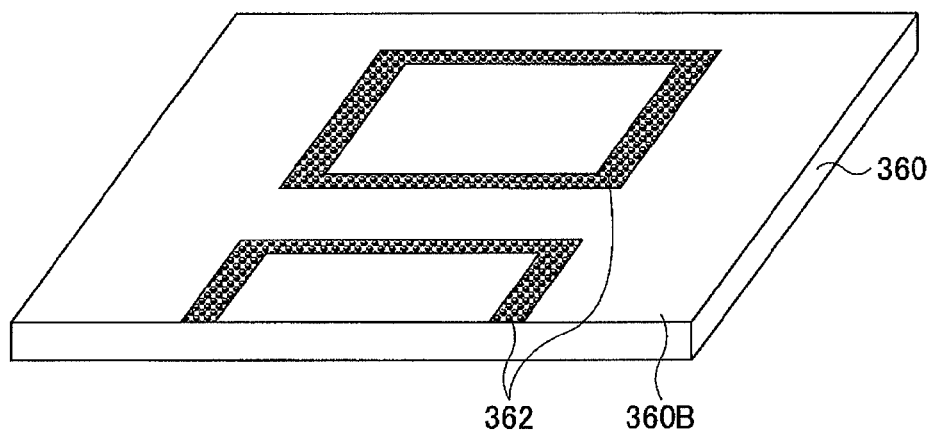
Figure 8D:
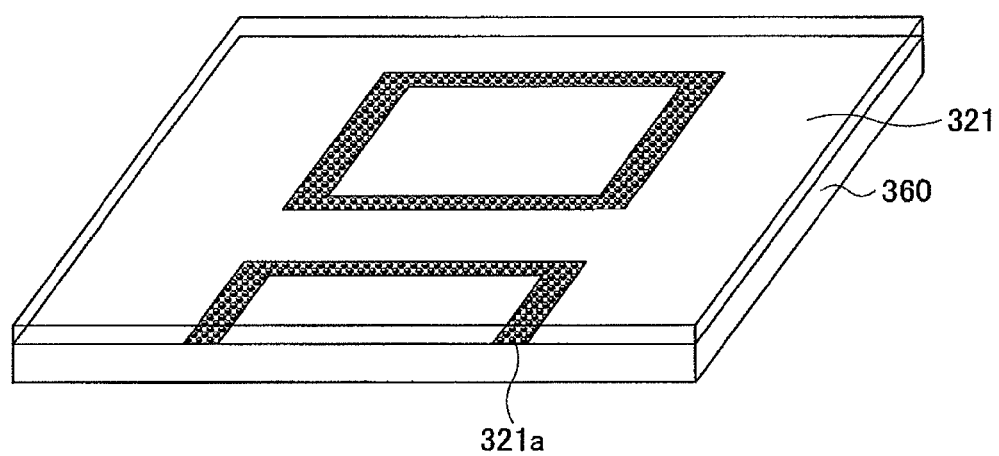

Next, as illustrated in FIG. 8C, a water dropping film 362 is formed by spraying water vapor. Because the formation of the water dropping is suppressed in the hydrophilic region 360B, the water droplet film 362 is selectively formed on the water repellent region 360A by a plurality of water droplets that are arranged regularly. Then, as illustrated in FIG. 8D, a resin is coated on the water repellent sheet 360 formed with the water droplet film 362, in order to form the resin sheet 321. The resin sheet 321 includes a plurality of pores 321*a* that are regularly arranged in accordance with the water droplet pattern of the water droplet film 362.

This example of the method of fabricating the resin sheet uses the water droplet film 362. However, the resin sheet 321 partially formed with the pores 321*a* may be fabricated by other methods. For example, a resin sheet impregnated in advance with a flame retardant or a foaming agent, such as Softron (registered trademark) manufactured by Sekisui Co., Ltd., may be subjected to an electron beam irradiation to form a pores with a desired pattern, in order to obtain a flame retardant resin sheet that is locally controlled of its generation of pores.

The housing 300 may be fabricated using the method of fabricating the housing 100 of the first embodiment described above in conjunction with FIGS. 4A through 4E, except that the resin sheets 321 is used in place of the resin sheets 121. Because the resin sheets 321 are used, the region of the resin sheet 321 formed with the pores 321*a* may be aligned to oppose the curved region of each of the dies 150-1 and 150-2 in a process (or step) corresponding to that described above in conjunction with FIG. 4D.

Next, a description will be given of examples of the electronic equipment using one of the plate members or the housings 100, 200 and 300, by referring to FIGS. 9 through 11. The examples of the electronic equipment includes a housing (for example, the housing 100) having the decorative feature of the wood grain on the at least a part of (that is, the decorative surface) of the housing.

Figure 9:
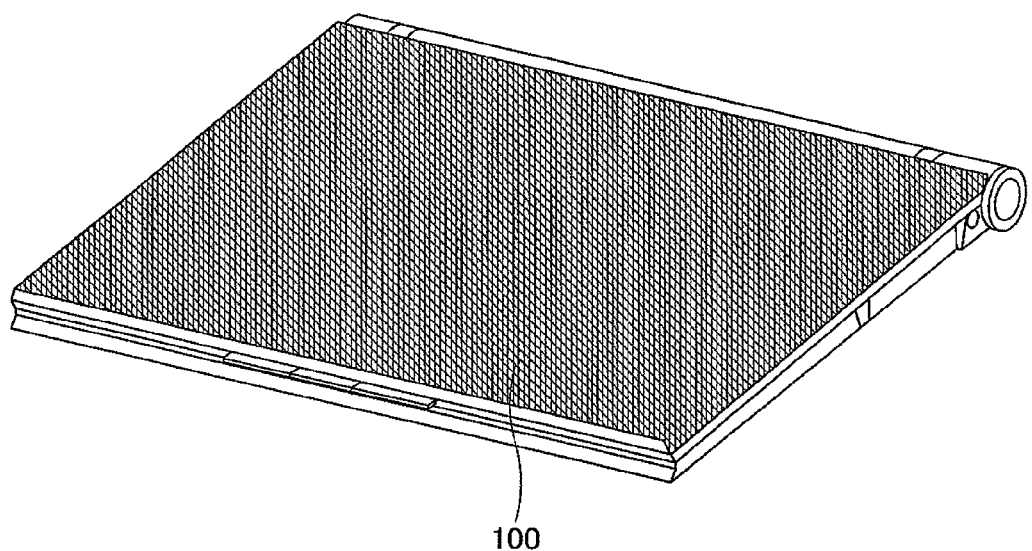
FIG. 9 is a perspective view illustrating an example of an electronic equipment having the housing of one of the embodiments.

FIG. 9 is a perspective view illustrating an example of an electronic equipment having the housing of one of the embodiments. In the example illustrated in FIG. 9, a lap-top PC 400 uses the housing 100, and the decorative feature of the wood grain may be provided on an upper lid housing part including a top plate. The lap-top PC 400 may include the decorative feature of the wood grain provided on a surface other than the top surface, such as a bottom surface of a lower lid housing part, in place of the top surface. In addition, the lap-top PC 400 may include the decorative feature of the wood grain provided on one or more surfaces other than the top surface, in addition to the top surface.

Figure 10:
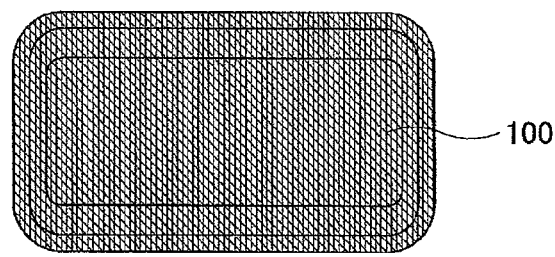
FIG. 10 is a plan view illustrating another example of the electronic equipment having the housing of one of the embodiments.

FIG. 10 is a plan view illustrating another example of the electronic equipment having the housing of one of the embodiments. In the example illustrated in FIG. 10, a portable telephone 500 uses the housing 100 which forms essentially the entire portable telephone 500 except for a display part and one or more operation buttons. The decorative feature of the wood grain may be provided on the external surface of the housing 100, excluding the display and the operation buttons. In addition, each operation button may be formed as a wood part by a housing 100.

Figure 11:
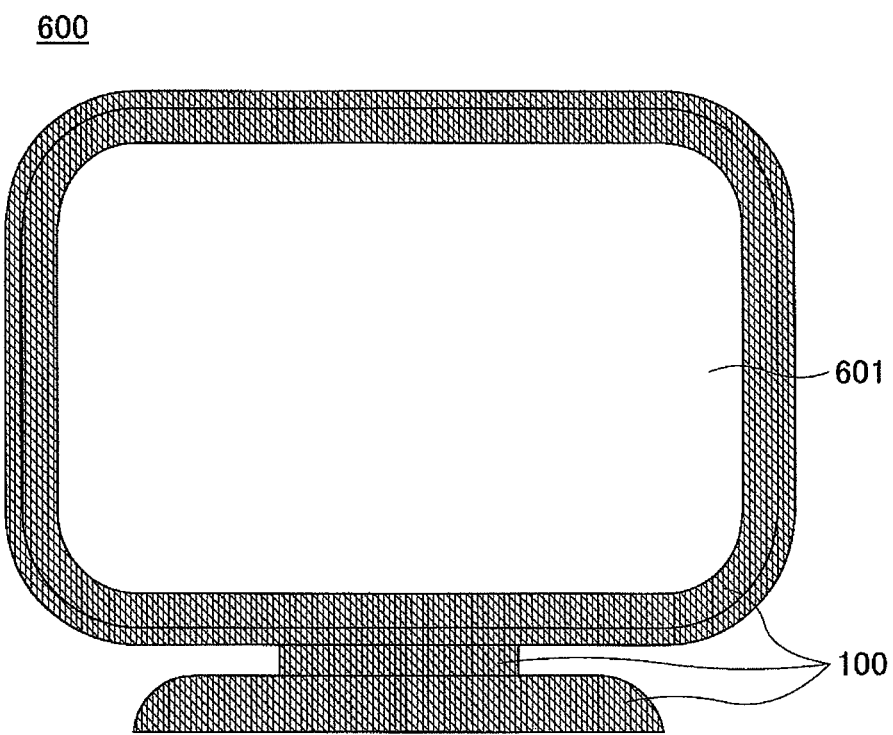
FIG. 11 is a front view illustrating still another example of the electronic equipment having the housing of one of the embodiments.

FIG. 11 is a front view illustrating still another example of the electronic equipment having the housing of one of the embodiments. In the example illustrated in FIG. 11, a display unit 600 of a monitor or a television receiver uses the housing 100 which forms essentially the entire display unit 600 except for a display screen 601. The decorative feature of the wood grain may be provided on the external surface of the housing 100, excluding the display screen 601.

Of course, the housing 200 or the housing 300 may be used for the lap-top PC 400, the portable telephone 500, and the display unit 600 illustrated in FIGS. 9 through 11.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A plate member for a housing, comprising:
a wood part including a plurality of wood plates that are stacked;
a resin part, adhered on the wood part, and including a plurality of resin sheets that are stacked, wherein each of the plurality of resin sheets includes a plurality of pores, in a form of bubbles, formed inside each of the plurality of resin sheets; and
at least one of a flame retardant film and a fire-resistant layer formed on inner walls defining the plurality of pores in each of the plurality of resin sheets.

2. A plate member for a housing, comprising:
a wood part including a plurality of wood plates that are stacked;
a resin part, adhered on the wood part, and including a plurality of resin sheets that are stacked, wherein each of the plurality of resin sheets includes a plurality of pores, in a form of bubbles, formed inside each of the plurality of resin sheets; and
at least one of an adhesion preventing film configured to prevent adhesion of inner walls defining the plurality of pores in each of the plurality of resin sheets, and a bonding preventing layer configured to prevent bonding of the inner walls defining the plurality of pores in each of the plurality of resin sheets.

\* \* \* \* \*